United States Patent [19]
Lin et al.

[11] Patent Number: 5,985,749
[45] Date of Patent: *Nov. 16, 1999

[54] METHOD OF FORMING A VIA HOLE STRUCTURE INCLUDING CVD TUNGSTEN SILICIDE BARRIER LAYER

[75] Inventors: Xi-Wei Lin, Fremont; Subhas Bothra, San Jose, both of Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/881,614

[22] Filed: Jun. 25, 1997

[51] Int. Cl.$^6$ .................................................. H01L 21/28
[52] U.S. Cl. ...................... 438/623; 438/624; 438/627; 438/639; 438/649
[58] Field of Search .................................... 438/623, 627, 438/628, 629, 630, 637, 649, 643, 644, 655, 653, 624, 639, 680; 257/759, 757, 763

[56] References Cited

U.S. PATENT DOCUMENTS

| | | | |
|---|---|---|---|
| 5,268,329 | 12/1993 | Chittipeddi et al. | 438/630 |
| 5,371,041 | 12/1994 | Liou et al. | 438/655 |
| 5,529,955 | 6/1996 | Hibino et al. | 438/672 |
| 5,604,158 | 2/1997 | Cadien et al. | 438/645 |

OTHER PUBLICATIONS

Chen, J.R., et al., "Growth of tungsten silicide films by low pressure CVD method," Vacuum, vol. 37, Nos. 3/44, 1987, pp. 357–361.

Wolf, S., Silicon Processing for the VLSi Era, Lattice Press, vol. 2, 1990, pp. 189–194, 229–236.

*Primary Examiner*—T. N. Quach
*Attorney, Agent, or Firm*—Burns, Doane, Swecker & Mathis LLP

[57] ABSTRACT

The invention relates to integrated circuits and to via hole structures which include a tungsten silicide barrier layer and to methods of forming such via hole structures. In an exemplary embodiment, a metal layer is formed on a sidewall and a bottom surface of the via hole, a $WSi_x$ barrier layer is formed on the first metal layer by chemical vapor deposition and the via hole is subsequently filled with a metal. The tungsten silicide barrier layer effectively suppresses device degradation resulting from the release of gaseous species from the sidewall of the via hole during plug formation. Semiconductor devices can thus be fabricated which are immune or less susceptible to metal open failures due to incomplete via filling.

11 Claims, 3 Drawing Sheets

METHOD OF FORMING A VIA HOLE STRUCTURE INCLUDING CVD TUNGSTEN SILICIDE BARRIER LAYER

BACKGROUND OF THE INVENTION

1. Field of the Invention

The present invention relates generally to integrated circuits and via hole structures for fabricating integrated circuits. More particularly, the invention relates to via hole structures which include a tungsten silicide barrier layer and to methods of forming such via hole structures.

2. State of the Art

In the manufacture of semiconductor devices, ever-decreasing device geometries have led to problems impacting adversely on device yield. For example, in devices utilizing organic spin-on-glass (SOG) for gap fill/planarization and chemical vapor deposited (CVD) tungsten for via hole plug formation, poisoning of the reaction between silane ($SiH_4$) or hydrogen gas ($H_2$) and tungsten hexafluoride ($WF_6$) is a common occurrence. Such poisoning results from the outgassing of various materials from SOG at the via hole sidewall, such as water vapor and organic contaminants. Although conventional procedures for SOG coating include a post-coating bake to drive off the organic solvent and cure the layer, outgassing sources still remain in the layer. The released gas species can interfere with the tungsten CVD reaction by interacting with tungsten hexafluoride to severely alter the deposition chemistry. Voids in the tungsten plug are created, resulting in via open failures.

A commonly used solution to the above-described problem is the SOG etchback process to avoid the presence of SOG at the via sidewall. After coating a semiconductor wafer with SOG, the SOG is present in various thicknesses across the device depending on surface topography. The SOG layer is next plasma etched to the point of full removal at locations where via holes are to be formed, e.g., over metal lines, with SOG remaining in the gaps between the metal lines. This method, however, places stringent requirements on the etchback process and significantly narrows the process latitude for global planarization.

A second proposed solution to prevent SOG outgassing during CVD tungsten deposition is to sputter deposit a titanium nitride (TiN) barrier layer between the walls of the via hole and the subsequently formed tungsten plug. FIG. 1(A) illustrates a known via hole structure 100 which includes a titanium nitride barrier layer 110. After depositing metal layer 102, oxide layer 104, SOG layer 106 and oxide layer 108, via hole masking and etching is performed. Metal layer 102 forms the bottom wall of the via hole, with layers 104, 106 and 108 being exposed at the sidewalls. A thin titanium nitride layer 110 is then deposited by a sputtering process on the bottom and sidewalls of the via hole.

Titanium nitride layer 110, however, is not an effective barrier layer for the prevention of via hole poisoning, as voids 114 continue to be formed. The ineffectiveness of the titanium nitride layer stems in part from the creation of a reentrant profile 116 around the exposed SOG layer during the via etch process. Due to shadowing effects during the titanium nitride sputtering process, the titanium nitride coating along the via hole sidewall is discontinuous. As a result, SOG outgassing cannot be prevented.

FIG. 1(B) shows microcracks 120 present in titanium nitride layer 110. Some of the microcracks can extend completely through layer 110 from the via hole sidewall to the interior of the via hole. Such microcracks provide a path for the diffusion of outgassed contaminants from SOG layer 106 through barrier layer 110 to the via hole interior. Poisoning of the tungsten plug reaction and the formation of voids 114 can occur as a result.

Furthermore, grain boundaries 118 in titanium nitride film 110 provide an additional path for diffusion of the water vapor and/or organic contaminants from SOG layer 106 to the via hole interior. This diffusion along the grain boundaries can also lead to poisoning of the tungsten reaction. While use of a titanium nitride barrier layer can reduce the occurrence of via hole poisoning, open failures in via holes due to incomplete via filling remain a significant problem in device fabrication.

SUMMARY OF THE INVENTION

In accordance with exemplary embodiments of the present invention, a chemical vapor deposited (CVD) tungsten silicide ($WSi_x$) film is used as a barrier layer in a via hole structure. As referenced herein, tungsten silicide and WSiX refer to films in which the tungsten and silicon atoms are present in stoichiometric or non-stoichiometric proportions. The tungsten silicide film effectively seals off any weak spots present in a physical vapor deposited metal film to suppress outgassing of species from an organic material containing layer, such as SOG, during the subsequent deposition of a metal plug. Semiconductor devices can thus be fabricated which are immune or less susceptible to via open failures due to incomplete filling of via holes.

Exemplary methods of forming a via hole structure in a semiconductor device include the steps of: (a) forming a metal layer on a sidewall and a bottom surface of the via hole; (b) depositing a $WSi_x$ layer on the first metal layer, the $WSi_x$ layer being formed by chemical vapor deposition; and (c) subsequently filling the via hole with a metal. The metal layer of step (a) can comprise titanium nitride and the metal used to fill the via hole can be CVD tungsten. The use of tungsten allows for sequential deposition of the WSiX barrier layer and the tungsten via fill in the same processing chamber without exposure of the substrate to atmosphere.

According to an exemplary embodiment, a via hole structure in a semiconductor device is provided which includes: (a) a first metal layer on a sidewall and a bottom surface of the via hole; (b) a $WSi_x$ layer on the first metal layer, the $WSi_x$ layer being formed by chemical vapor deposition; and (c) a metal over the $WSi_x$ layer which fills the via hole.

BRIEF DESCRIPTION OF THE DRAWINGS

These and other advantages and objects of the invention will become more apparent from the following detailed description of preferred embodiments when read in conjunction with the attached figures in which.

DETAILED DESCRIPTION OF THE PREFERRED EMBODIMENTS

Methods and devices according to the invention can be used in any process and/or device which involve gap fill and CVD via fill, such as CVD plug formation processes. In an exemplary embodiment, a tungsten silicide ($WSi_x$) CVD film effectively prevents the poisoning of the CVD reaction used to deposit a metal plug which fills a via hole. The metal plug provides an electrical connection between two metal lines.

Figure 1:
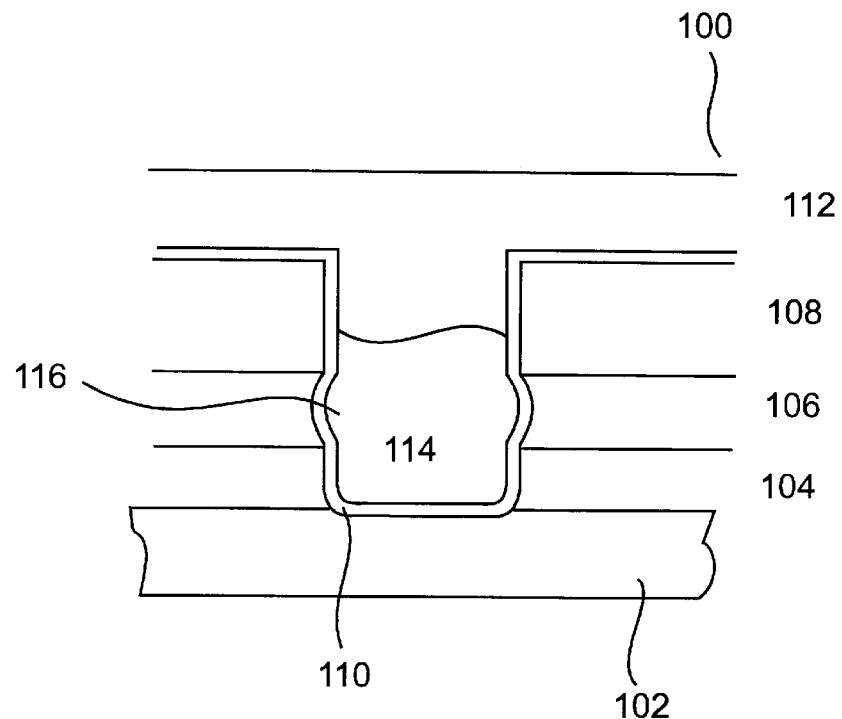
FIGS. 1(A) and 1(B) are cross-sectional and partial cross-sectional views, respectively, of a conventional via hole structure.
Figure 1:
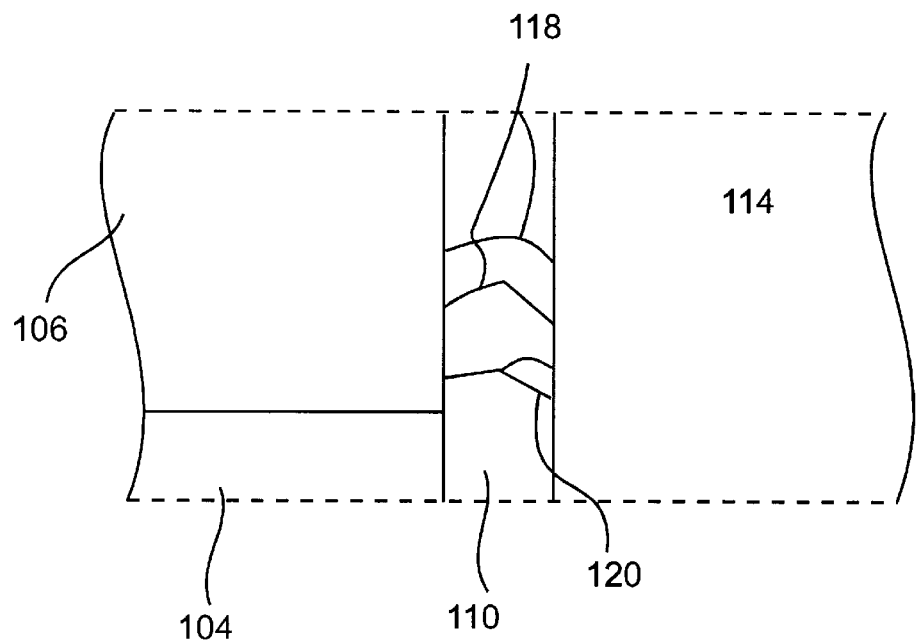
Figure 2:
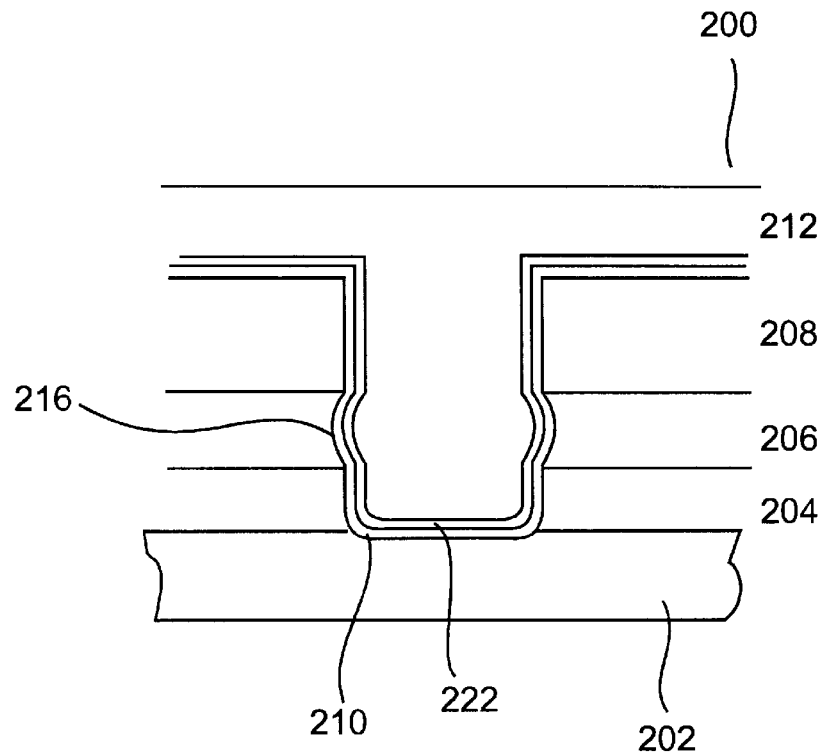
FIGS. 2(A) and 2(B) are cross-sectional and partial cross-sectional views, respectively, of a via hole structure according to an exemplary embodiment of the present invention.
Figure 2:
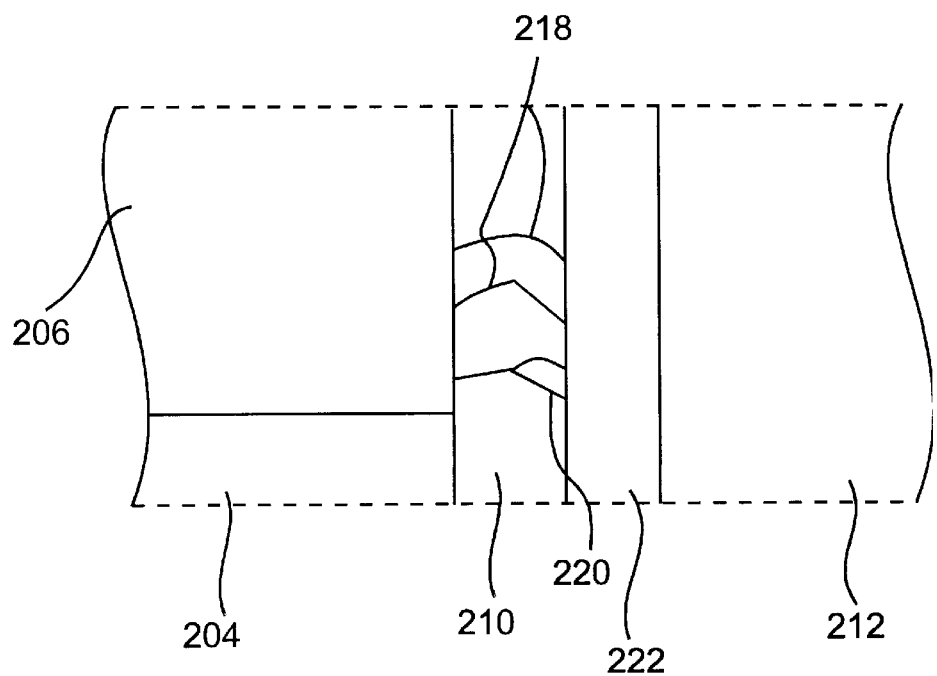

A generalized cross-section of a via hole in a semiconductor device according to an exemplary embodiment is illustrated in FIG. 2(A). Each of the layers is formed and/or patterned using conventional semiconductor fabrication techniques, such as sputtering, spin-coating, photolithographic patterning, etching, and/or any process involving chemical vapor deposition or physical vapor deposition.

After depositing and patterning metal 202, which can be, for example, aluminum or an alloy thereof, one or more dielectric layers 204 are deposited thereover. Suitable dielectric layers 204 include, for example, a silicon oxide or doped oxide (e.g., PSG or BPSG) or silicon oxynitride.

An organic material-containing layer 206 is deposited over dielectric layer 204, for example, for gap fill/surface planarization purposes. The organic material-containing layer is one which during subsequent processing produces outgassing species, such as water vapor and/or organic vapors, which are harmful to the CVD plug formation reaction in the way of via hole poisoning. Organic spin-on-glass (SOG) is one example of such an organic-containing material.

Following coating of organic material-containing layer 206, one or more additional dielectric layers 208 are deposited over layer 206. Like dielectric layer 204, suitable dielectric layers 208 include, for example, a silicon oxide or doped oxide or silicon oxynitride. Dielectric layer 208 can be the same as or different from layer 204.

Next, photolithographic masking and etching of layers 204, 206 and 208 are performed to form a via hole. Metal layer 202 forms the bottom wall of the via hole, with layers 204, 206 and 208 being exposed at and forming the via hole sidewall.

To decrease the flow of outgassing contaminants from the via hole sidewall into the contact hole, a metal layer 210 is formed on the sidewall and bottom surfaces of the via hole. Metal layer 210 thus acts as a first barrier layer to the flow of outgassed species. In addition to preventing the diffusion of contaminants from organic material-containing layer 206 to the contact hole, metal layer 210 must also provide sufficiently low resistivity so as not to adversely affect device performance. Preferably, metal layer 210 is titanium (Ti), titanium nitride (TiN) or a titanium/titanium nitride bilayer which is formed by a physical vapor deposition process, such as sputter deposition. While the thickness of layer 210 (as well as the other layers being formed) depends on the specific device being formed, the layer can be deposited at a thickness of from about 100 to 2000 Å, more preferably from about 300 to 700 Å and most preferably about 500 Å.

Due to the reentrant profile 216 of organic material-containing layer 206, metal layer 210 is deposited non-uniformly along the via hole sidewall. Outgassed contaminants from layer 206 can diffuse through paths in metal layer 210 in the form of microcracks 220 and grain boundaries 218. Through the present invention, it has been found that use of a CVD tungsten silicide barrier layer 222 in addition to the first barrier layer provides exceptional results in significantly decreased via fill failures.

In particular, CVD tungsten silicide allows for a conformally deposited film around reentrant SOG sidewalls which film is substantially impervious to the outgassed species generated by organic material-containing layer 206. Thus, interaction between the organic material-containing layer and the subsequently deposited metal 212 which fills the via hole can effectively be prevented.

Suitable systems for depositing the tungsten silicide layer are well known to those skilled in the art, and include, for example, the Applied Materials Precision 5000 CVD system.

CVD tungsten silicide is formed by introducing silane and tungsten hexafluoride into a reaction chamber containing a semiconductor wafer to be treated. In addition to the primary reactants, inert gases can be introduced into the chamber. Suitable inert gases include, for example, nitrogen ($N_2$), argon (Ar), helium (He) or mixture thereof.

The wafer is heated during deposition, with the temperature being maintained at from about 350 to 450° C., more preferably from about 375 to 425° C. and most preferably about 400° C.

While reactor pressure will depend on the particular CVD system being employed, the pressure can generally range from about 0.1 to 10 Torr, with 4.5 Torr being typical. However, persons skilled in the art recognize that the pressure is not limited thereto.

Since the CVD tungsten silicide yields a conformal film over via structures, it has been found that a thin layer is sufficient to prevent diffusion of the outgassed species into the via hole. The tungsten silicide can be deposited over metal layer 210 at a thickness of from about 100 to 500 Å, and more generally from about 50 to 700 Å or 30 to 2000 Å. Of course, these thicknesses are in no way limiting, with the desired thickness being dependent on the type of device being formed.

According to a further aspect of the present invention, it has been found that the gas flow rate ratio for silane to tungsten hexafluoride during tungsten silicide deposition has a significant influence on via failure rate. The chemical equation for the reaction between silane and tungsten hexafluoride in the formation of stoichiometric tungsten silicide is set forth below:

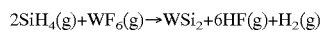

$$2SiH_4(g) + WF_6(g) \rightarrow WSi_2 + 6HF(g) + H_2(g)$$

To obtain stoichiometric tungsten silicide ($WSi_2$), the ratio of silane to tungsten hexafluoride is 2 to 1. It has, however, been determined that a decrease in via failures can be attained by running the reaction with an excess of silane. By use of an excess of silane, interaction between the tungsten hexafluoride and the contaminants from the organic material-containing layer during tungsten silicide deposition can be prevented. In an exemplary embodiment of the invention, the silane to tungsten hexafluoride ratio is adjusted to a value of 2 to 1 or more.

Figure 3:
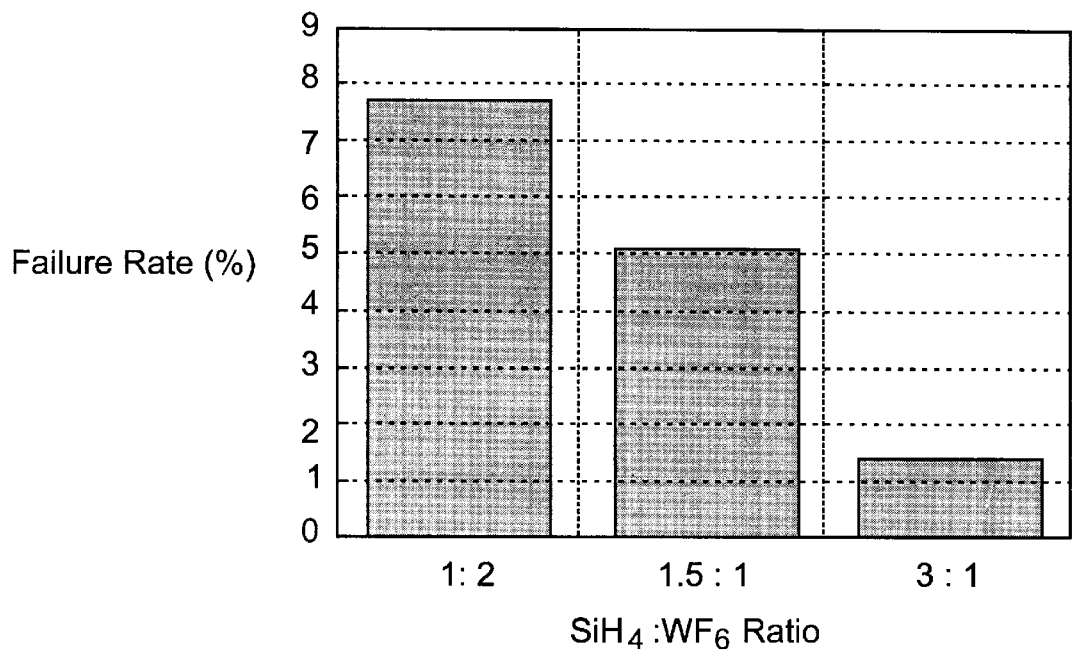
FIG. 3(A) is a bar graph showing via failure rates as a function of the silane to tungsten hexafluoride ratio.
FIG. 3(B) is a sample via chain test pattern.
Figure 3:
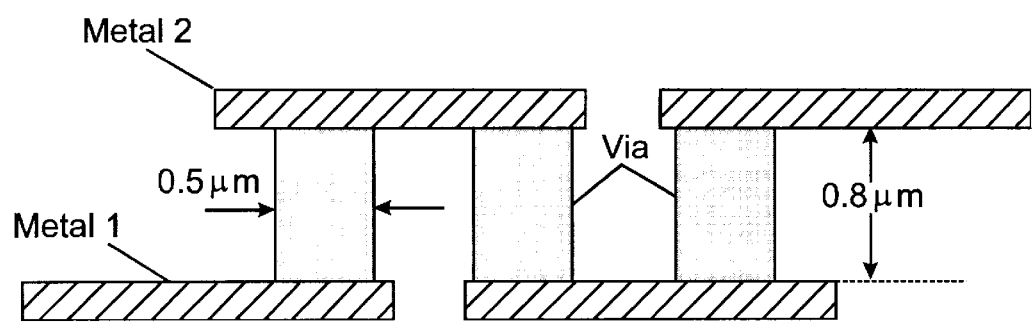

FIG. 3(A) shows experimental results comparing via chain failure rates for various silane to tungsten hexafluoride ratios during tungsten silicide deposition. The open circuit failure rates were determined using test chips containing up to 900 via chains, with each chain containing 7020 vias in series. An example of the via chain test pattern employed is illustrated in FIG. 3(B). As can be seen in that figure, the via holes in the test chips were about 0.5 μm in diameter and about 0.8 μm in height. Silicon oxide and SOG were exposed at the via hole side walls. Tungsten silicide was deposited over titanium nitride in the via hole, and the via hole was then filled with CVD tungsten. Adjacent via holes were connected by metal 1 layer (TiN/Al/TiN) and metal 2 layer, which was identical to metal 1 layer. The results clearly show that marked decreases in failure rate can be obtained with increasing silane to tungsten hexafluoride ratio.

Referring again to FIG. 2, following deposition of tungsten silicide layer 222, the via hole is filled with a metal 212 by chemical vapor deposition. This step is commonly referred to as metal plug formation. Metal 212 can be, for example, tungsten, aluminum or copper. Of these, tungsten is advantageous because certain process gases used in CVD tungsten are common to those used in forming the WSi$_x$ layer. Thus, the tungsten silicide deposition process can easily be incorporated in process flows already using CVD tungsten for plug formation. As a result, deposition of metal layer 212 can immediately follow tungsten silicide deposition using the same processing chamber without exposing the wafer being treated to air.

With reference to FIG. 2(B), it can be seen that WSi$_x$ layer 222 is conformal and crack-free. As a result, outgassing species from organic-material containing layer 206 can effectively be prevented from penetrating through tungsten silicide layer 222 and into the via hole during plug formation. Thus, metal 212 can completely fill the via hole, and open failures due to incomplete filling of the via can be significantly reduced.

While the foregoing description pertains specifically to the formation of a via hole connecting two metal layers, the inventive method and structure can equally be applied to the formation of contact hole structures which connect a metal layer and a semiconductor layer, such as an electrode, or a metal layer and a region of the semiconductor substrate, such as a source or drain region.

It will be appreciated by those skilled in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of forming a via hole structure in a semiconductor device, comprising the steps of:
   (a) forming one or more dielectric layers over a substrate surface comprising an aluminum or aluminum alloy metal pattern;
   (b) depositing a spin-on-glass layer over the one or more dielectric layers;
   (c) forming one or more additional dielectric layers over the spin-on-glass layer;
   (d) forming a via hole through the one or more additional dielectric layers, the spin-on-glass layer and the one or more dielectric layers, the via hole extending to a top surface of the aluminum or aluminum alloy metal pattern and being bounded by a sidewall comprising the one or more dielectric layers, the spin-on-glass layer and the one or more additional dielectric layers;
   (e) forming a titanium layer, a titanium nitride layer or a titanium/titanium nitride bilayer on the sidewall and on the aluminum or aluminum alloy metal pattern within the via hole, said layer having a thickness of from about 100 to 2000 Å;
   (f) depositing a tungsten silicide layer on the layer formed in step (e), the tungsten silicide layer being formed by chemical vapor deposition and having a thickness of from about 50 to 700 Å; and filling the via hole with tungsten by depositing tungsten on the tungsten silicide, the tungsten silicide layer suppresses outgassing of the spin-on-glass layer during deposition of the tungsten.

2. The method according to claim 1, wherein the titanium layer, the titanium nitride layer or the titanium/titanium nitride bilayer of step (e) is deposited by physical vapor deposition.

3. The method according to claim 2, wherein or the layer of step (e) is a titanium nitride layer.

4. The method according to claim 2, wherein the layer of step (e) is a titanium/titanium nitride bilayer.

5. The method according to claim 1, wherein the titanium layer, the titanium nitride layer or the titanium/titanium nitride bilayer of step (e) has a thickness of from about 300 to 700 Å.

6. The method according to claim 1, wherein the tungsten silicide chemical vapor deposition comprises reacting silane with tungsten hexafluoride.

7. The method according to claim 6, wherein the ratio of silane flowrate to tungsten hexafluoride flowrate during the tungsten silicide chemical vapor deposition is from 2:1 to 3:1.

8. The method according to claim 1, wherein during the tungsten silicide layer deposition, the substrate being treated is heated to a temperature from about 350 to 450° C.

9. The method according to claim 1, wherein the tungsten silicide layer is deposited with a thickness of from about 50 to 500 Å.

10. The method according to claim 1. wherein the tungsten is deposited by chemical vapor deposition.

11. The method according to claim 1, wherein the tungsten is deposited in the same processing chamber as the tungsten silicide layer.

* * * * *